United States Patent
Tseng

(10) Patent No.: US 7,902,898 B2
(45) Date of Patent: Mar. 8, 2011

(54) DELAY CIRCUIT

(75) Inventor: Jyi-Hung Tseng, Sinshih Township, Tainan County (TW)

(73) Assignee: Himax Analogic, Inc., Sinshih Township, Tainan County (TW)

( * ) Notice: Subject to any disclaimer, the term of this patent is extended or adjusted under 35 U.S.C. 154(b) by 0 days.

(21) Appl. No.: 12/399,102

(22) Filed: Mar. 6, 2009

(65) Prior Publication Data
US 2010/0225373 A1 Sep. 9, 2010

(51) Int. Cl.
*H03H 11/26* (2006.01)
(52) U.S. Cl. .......................................... 327/266
(58) Field of Classification Search .................. None
See application file for complete search history.

(56) References Cited

U.S. PATENT DOCUMENTS

| | | | | |
|---|---|---|---|---|
| 5,751,370 A * | 5/1998 | Lee | | 348/556 |
| 7,065,026 B2 * | 6/2006 | Hung et al. | | 369/59.17 |
| 7,230,561 B2 * | 6/2007 | Lee | | 341/172 |
| 7,502,235 B2 * | 3/2009 | Huang et al. | | 363/21.01 |
| 7,504,897 B2 * | 3/2009 | Chava et al. | | 331/78 |
| 7,535,269 B2 * | 5/2009 | Utsuno | | 327/116 |
| 2004/0141450 A1 * | 7/2004 | Hung et al. | | 369/59.17 |
| 2009/0108892 A1 * | 4/2009 | Chen et al. | | 327/157 |
| 2009/0184697 A1 * | 7/2009 | Park | | 323/280 |

\* cited by examiner

*Primary Examiner* — Lincoln Donovan
*Assistant Examiner* — Sibin Chen
(74) *Attorney, Agent, or Firm* — Thomas, Kayden, Horstemeyer & Risley, LLP

(57) ABSTRACT

A delay circuit includes current sources, switches, a transistor switch, a charging unit and a comparator. Each of the switches is provided for receiving an enable signal to activate and convey one of the current sources. The transistor switch is activated for pulling down voltage of an operating node coupled to the switches. The charging unit provides an operating voltage for the operating node based on one of the current sources when the transistor switch is deactivated and one of the switches is activated to convey one of the current sources to the charging unit. The comparator is provided for comparing the operating voltage with a reference voltage.

10 Claims, 4 Drawing Sheets

DELAY CIRCUIT

BACKGROUND

1. Field of Invention

The present invention relates to a delay circuit. More particularly, the present invention relates to a delay circuit in a reset integrated circuit (IC).

2. Description of Related Art

For a conventional reset integrated circuit (IC) employed for circuit protection, a delay circuit therein is usually provided for preventing the reset IC from mis-operation caused by a power glitch, in which the delay time configured by the delay circuit can be correspondingly changed by using different extrinsic capacitors. However, it is not convenient to replace different extrinsic capacitors whenever various kinds of delay time are to be configured.

SUMMARY

In accordance with one embodiment of the present invention, a delay circuit is provided. The delay circuit includes a plurality of current sources, a plurality of switches, a transistor switch, a charging unit and a comparator. Each of the switches is provided for receiving an enable signal to activate and convey one of the current sources. The transistor switch is activated for pulling down voltage of an operating node coupled to the switches. The charging unit provides an operating voltage for the operating node based on one of the current sources when the transistor switch is deactivated and one of the switches is activated to convey one of the current sources to the charging unit. The comparator is provided for comparing the operating voltage with a reference voltage.

In accordance with another embodiment of the present invention, a delay circuit is provided. The delay circuit includes a plurality of current sources, a plurality of switches, a transistor switch, a charging unit and a comparator. Each of the switches has a first end and a second end, in which the first end of each of the switches is coupled to one of the current sources, and the second ends of the switches are coupled to an operating node. The transistor switch is coupled between the operating node and a low voltage and activated for pulling down voltage of the operating node. The charging unit is coupled between the operating node and the low voltage. The comparator has a first input coupled to the operating node and a second input coupled to a reference voltage.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference to the accompanying drawings as follows.

DESCRIPTION OF THE EMBODIMENTS

In the following detailed description, the embodiments of the present invention have been shown and described. As will be realized, the invention is capable of modification in various respects, all without departing from the invention. Accordingly, the drawings and description are to be regarded as illustrative in nature, and not restrictive.

Figure 1:
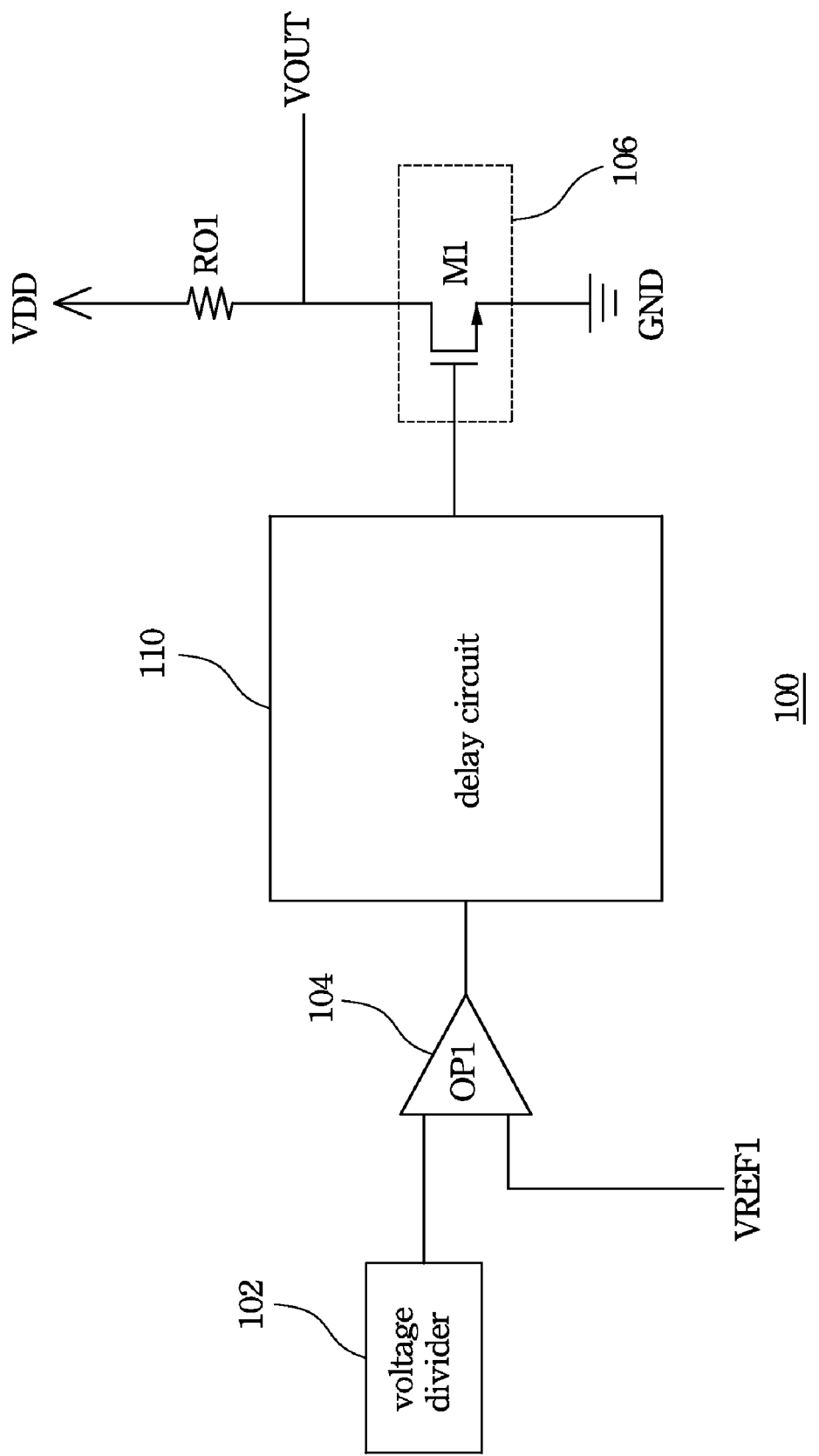
FIG. 1 illustrates a general block diagram of a reset integrated circuit (IC) according to one embodiment of the present invention.

FIG. 1 illustrates a general block diagram of a reset integrated circuit (IC) according to one embodiment of the present invention. The reset integrated circuit 100 includes a voltage divider 102, a comparator 104, a delay circuit 110, and a transistor switch 106, in which the comparator 104 can be an operational amplifier OP1 and the transistor switch 106 can be an NMOS transistor M1. The voltage divider 102 provides a dividing voltage for the comparator 104. The comparator 104 compares the dividing voltage from the voltage divider 102 with a reference voltage VREF1 and thus generates an output signal. The delay circuit 110 is provided for delaying the output signal from the comparator 104. The transistor switch 106 operates with the delayed output signal and generates an output signal VOUT. Specifically, when the voltage divider 102 provides a dividing voltage larger than the reference voltage VREF1, due to a high power voltage, the comparator 104 generates a deactivation signal. Then, the delay circuit 110 delays the deactivation signal for deactivating the transistor switch 106, and the output signal VOUT, being a reset signal or a protection signal, is accordingly generated.

Figure 2:
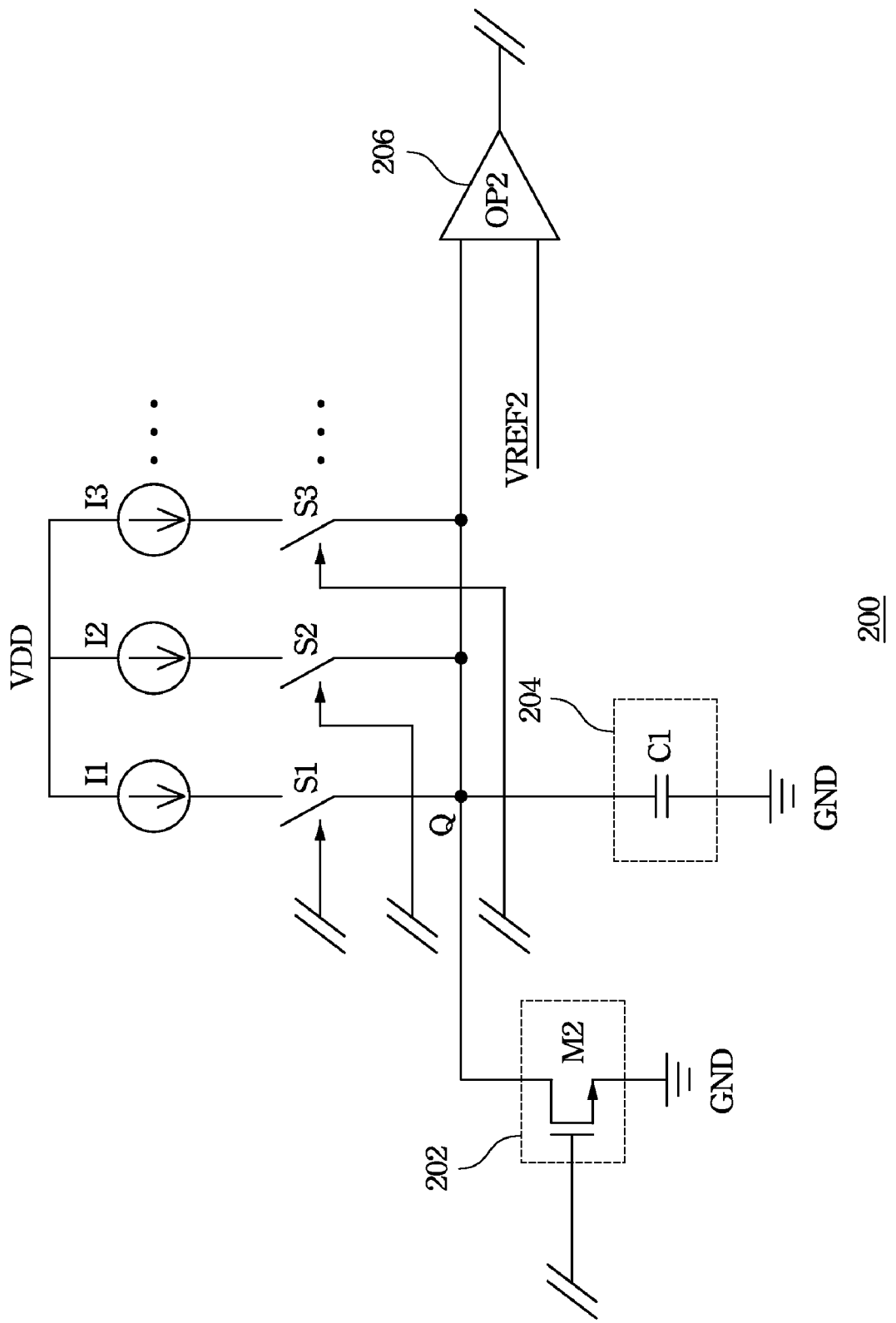
FIG. 2 illustrates the delay circuit as shown in FIG. 1 according to one embodiment of the present invention.

FIG. 2 illustrates the delay circuit as shown in FIG. 1 according to one embodiment of the present invention. The delay circuit includes a plurality of current sources (i.e. I1, I2, I3, etc.), a plurality of switches (i.e. S1, S2, S3, etc.), a transistor switch 202, a charging unit 204 and a comparator 206. The current sources I1, I2, I3 . . . can be configured as a geometric sequence; that is, the current source I1 has a current value of $I_0$, the current source I2 has a current value of $I_0 \times 2^1$, the current source I3 has a current value of $I_0 \times 2^2$, and etc. Each of the switches S1, S2, S3, . . . , is provided for receiving an enable signal to activate and convey the corresponding current sources I1, I2, I3, . . . . The transistor switch 202 is activated for pulling down the voltage of an operating node Q coupled to the switches S1, S2, S3, . . . . The charging unit 204 provides an operating voltage for the operating node Q based on one of the current sources I1, I2, I3, . . . when the transistor switch 202 is deactivated and one of the switches S1, S2, S3, . . . is activated to convey one of the current sources I1, I2, I3, . . . to the charging unit 204. The comparator 206 compares the operating voltage of the operating node Q with a reference voltage VREF2 and outputs an output signal to, for example, the transistor M1 as shown in FIG. 1.

As shown in FIG. 2, the transistor switch 202 can be an NMOS transistor M2, the charging unit 204 can be a capacitor C1, and the comparator 206 can be an operational amplifier OP2. The transistor M2 has a gate coupled to, for example, the output of the operational amplifier OP1 as shown in FIG. 1, a drain coupled to the operating node Q, and a source coupled to a ground voltage GND. The capacitor C1 is coupled between the operating node Q and the ground voltage GND. The operational amplifier OP2 has a first input coupled to the operating node Q and a second input coupled to the reference voltage VREF2. Moreover, each of the switches S1, S2, S3, . . . has a first end and a second end, in which the first ends of the switches S1, S2, S3, . . . are separately and correspondingly coupled to the current sources I1, I2, I3, . . . and the second ends of the switches S1, S2, S3, . . . are all coupled to the operating node Q.

In operation, when the transistor M2 receives the deactivation signal from, for example, the operational amplifier OP1 as shown in FIG. 1, to be deactivated and one of the switches S1, S2, S3, . . . is activated to convey one of the current sources I1, I2, I3, . . . to the capacitor C1 such that the capacitor C1 is charged by one of the current sources I1, I2, I3, . . . through one of the switches S1, S2, S3, . . . , the capacitor C1 will provide an operating voltage for the operating node Q. After that, if the operating voltage of the operating node Q provided by the capacitor C1 increases to be larger than the reference voltage VREF2, the operational amplifier OP2 outputs the output signal, being the delayed deactivation signal, to the transistor M1 as shown in FIG. 1 and deactivates the transistor M1.

Figure 3:
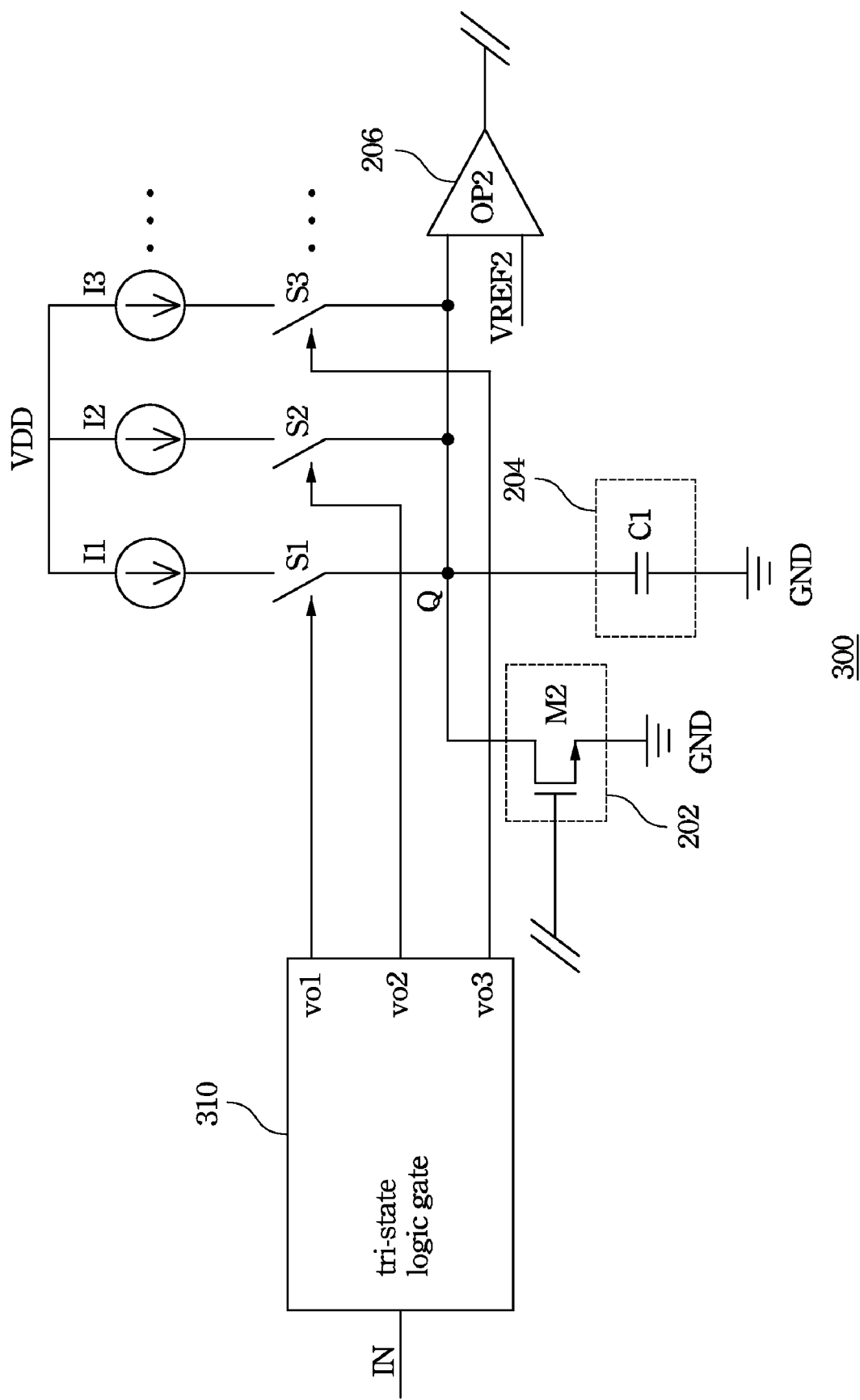
FIG. 3 illustrates the delay circuit as shown in FIG. 1 according to another embodiment of the present invention.

FIG. 3 illustrates the delay circuit as shown in FIG. 1 according to another embodiment of the present invention. Compared to FIG. 2, the delay circuit 300 further includes a tri-state logic gate 310. The tri-state logic gate 310 has a logic input IN and three logic outputs (i.e. VO1, VO2, VO3), in which each of the logic outputs is provided for outputting the enable signal to activate one of the switches (e.g. S1, S2, S3) based on the state of the logic input IN. For example, the logic output VO1 outputs the enable signal to activate the switch S1 if the logic input IN is at low level; the logic output VO2 outputs the enable signal to activate the switch S2 if the logic input IN is floated; and the logic output VO3 outputs the enable signal to activate the switch S3 if the logic input IN is at high level. In addition, the delay circuit 300 can further include multiple tri-state logic gates 310 for controlling even more switches.

Figure 4:
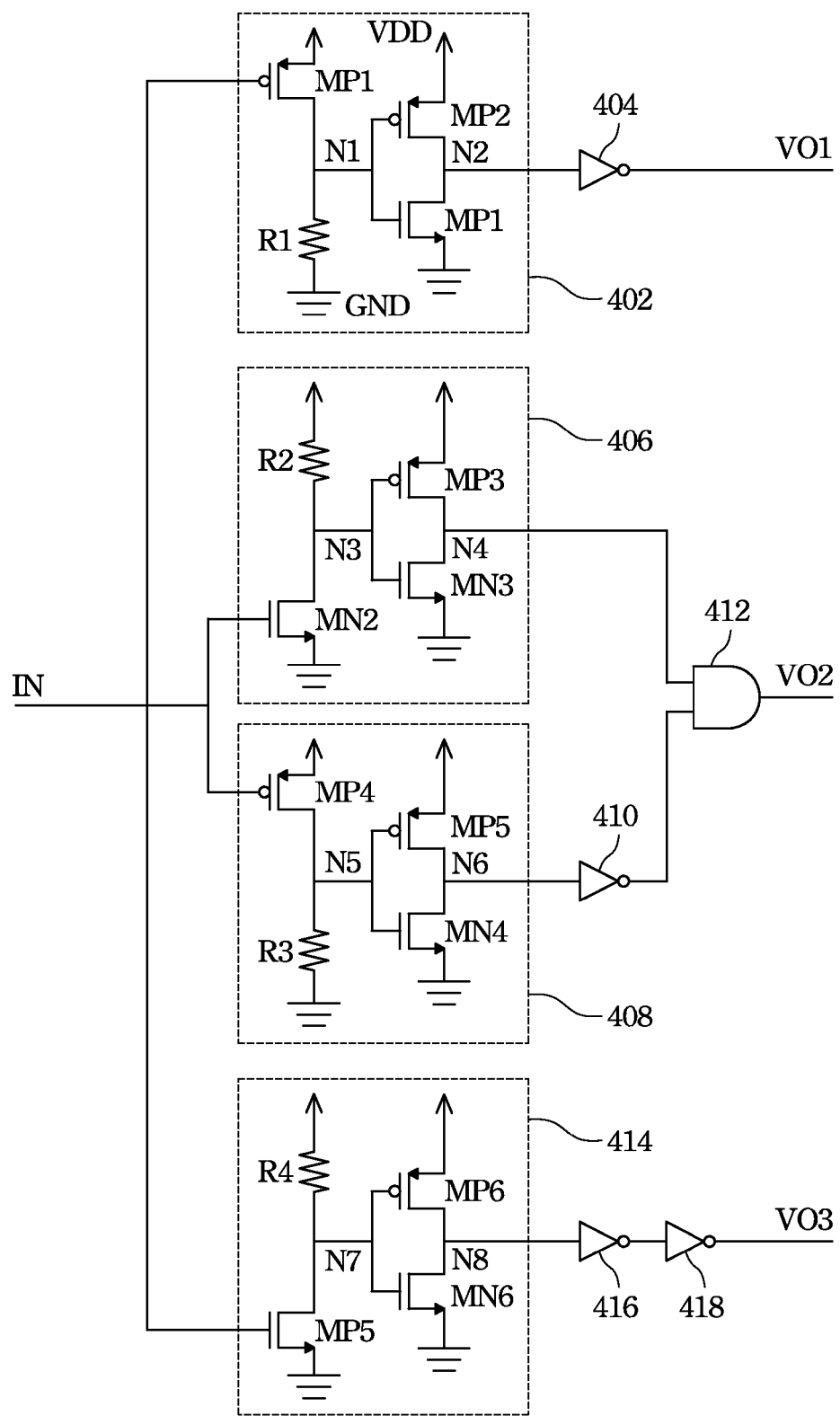
FIG. 4 illustrates the tri-state logic gate as shown in FIG. 3 according to one embodiment of the present invention.

FIG. 4 illustrates the tri-state logic gate as shown in FIG. 3 according to one embodiment of the present invention. The tri-state logic gate 400 includes three parts separately corresponding to the logic output VO1, VO2 and VO3. In regard to the logic output VO1, the tri-state logic gate 400 includes a pull-up unit 402 and an inverter 404. The pull-up unit 402 is coupled to the logic input IN and generates a low-level signal when the logic input IN is at low level. The inverter 404 is coupled between the pull-up unit 402 and the logic output VO1 and converts the low-level signal from the pull-up unit 402 into a high-level signal as the enable signal. In regard to the logic output VO2, the tri-state logic gate 400 includes a pull-down unit 406, a pull-up unit 408, an inverter 410 and a NAND logic unit 412. The pull-down unit 406 is coupled to the logic input IN and generates a low-level signal when the logic input IN is floated or at low level. The pull-up unit 408 is coupled to the logic input IN and generates a high-level signal when the logic input IN is floated or at high level. The inverter 410 converts the high-level signal from the pull-up unit 408 into a low-level signal. The NAND logic unit 412 has an output coupled to the logic output VO2 and performs NAND operation of the low-level signals from the pull-down unit 406 and the inverter 410 to generate a high-level signal as the enable signal. In regard to the logic output VO3, the tri-state logic gate 400 includes a pull-down unit 414 and inverters 416 and 418. The pull-down unit 414 is coupled to the logic input IN and generates a high-level signal when the logic input is at high level. The inverter 416 converts the high-level signal from the pull-down unit 414 into a low-level signal. The inverter 418 has an output coupled to the logic output VO3 and converts the low-level signal from the inverter 416 into a high-level signal as the enable signal.

In the present embodiment, the pull-up unit 402 includes a pull-up PMOS transistor MP1 and an inverter consisting of a PMOS transistor MP2 and an NMOS transistor MN1. The transistor MP1 has a gate coupled to the logic input IN, a source coupled to the power voltage VDD, and a drain coupled to the ground voltage GND through a resistor R1. The inverter 404 and the inverter consisting of the transistors MP2 and MN1 are serially coupled between the drain of the transistor MP1 and the logic output VO1.

Furthermore, the pull-down unit 406 includes a pull-down NMOS transistor MN2 and an inverter consisting of a PMOS transistor MP3 and an NMOS transistor MN3. The transistor MN2 has a gate coupled to the logic input IN, a drain coupled to the power voltage VDD through a resistor R2, and a source coupled to the ground voltage GND. The inverter consisting of the transistors MP3 and MN3 is coupled between the drain of the transistor MN2 and a first NAND input of the NAND logic unit 412. The pull-up unit 408 includes a pull-up PMOS transistor MP4 and an inverter consisting of a PMOS transistor MP5 and an NMOS transistor MN4. The transistor MP4 has a gate coupled to the logic input IN, a source coupled to the power voltage VDD, and a drain coupled to the ground voltage GND through a resistor R3. The inverter 410 and the inverter consisting of the transistors MP5 and MN4 are serially coupled between the drain of the transistor MP4 and a second NAND input of the NAND logic unit 412.

Moreover, the pull-down unit 414 includes a pull-down NMOS transistor MN5 and an inverter consisting of a PMOS transistor MP6 and an NMOS transistor MN6. The transistor MN5 has a gate coupled to the logic input IN, a drain coupled to the power voltage VDD through a resistor R4, and a source coupled to the ground voltage GND. The inverters 418 and 416 and the inverter consisting of the transistors MP6 and MN6 are serially coupled between the drain of the transistor MN5 and the logic output VO3.

In operation, the logic input IN has three different states which are "low" (logic 0), "high" (logic 1) and floating (unknown) at different moments. If the logic input IN is at low level, the node N1 is at high level, the node N2 is at low level, and the logic output VO1 is then at high level. At that moment, the node N3 is at high level such that the node N4 is at low level, and the node N5 is at high level such that the node N6 is at low level and the output of the inverter 410 is at high level, thus causing the logic output VO2 to be at low level. At the same time, the node N7 is at high level such that the node N8 is at low level, thus causing the logic output VO3 to be at low level.

In another aspect, if the logic input IN is floated, the node N1 is at low level such that the node N2 is at high level, thus causing the logic output VO1 to be at low level. At that moment, the node N3 is at high level such that the node N4 is at low level, and the node N5 is at low level such that the node N6 is at high level and the output of the inverter 410 is at low level, thus causing the logic output VO2 to be at high level. At the same time, the node N7 is at high level such that the node N8 is at low level, thus causing the logic output VO3 to be at low level.

In yet another aspect, if the logic input IN is at high level, the node N1 is at low level such that the node N2 is at high level, thus causing the logic output VO1 to be at low level. At that moment, the node N3 is at low level such that the node N4 is at high level, and the node N5 is at low level such that the node N6 is at high level and the output of the inverter 410 is at low level, thus causing the logic output VO2 to be at high level. At the same time, the node N7 is at low level such that the node N8 is at high level, thus causing the logic output VO3 to be at high level. The states of the logic outputs VO1, VO2 and VO3 corresponding to different states of the logic input IN can be shown in Table I as follows.

TABLE I

| IN | VO3 | VO2 | VO1 |
|----|-----|-----|-----|
| 0  | 0   | 0   | 1   |
| NA | 0   | 1   | 0   |
| 1  | 1   | 0   | 0   |

For the foregoing embodiments, the delay circuit can be employed to conveniently configure the delay time for the reset IC without replacing the capacitor. Moreover, there also can be multiple choices of configuring the delay time.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded with the broadest interpretation so as to encompass all such modifications and similar structures.

What is claimed is:

1. A delay circuit, comprising:
   a plurality of current sources;
   a plurality of switches each for receiving an enable signal to activate and convey one of the current sources;
   a transistor switch activated for pulling down voltage of an operating node coupled to the switches;
   a charging unit for providing an operating voltage for the operating node based on one of the current sources when the transistor switch being deactivated and one of the switches being activated to convey one of the current sources to the charging unit;
   a comparator for comparing the operating voltage with a reference voltage; and
   a tri-state logic gate having a logic input and three logic outputs each for outputting the enable signal to activate one of the switches, the tri-state logic gate further comprising:
      a first pull-up unit coupled to the logic input, for generating a low-level signal when the logic input is at low level;
      a first inverter coupled to a first of the logic outputs, for converting the low-level signal from the first pull-up unit into a high-level signal as the enable signal;
      a first pull-down unit coupled to the logic input, for generating a low-level signal when the logic input is floated or at low level;
      a second pull-up unit coupled to the logic input, for generating a high-level signal when the logic input is floated or at high level;
      a second inverter for converting the high-level signal from the second pull-up unit into a low-level signal; and
      a logic unit coupled to a second of the logic outputs, for performing NAND operation of the low-level signals from the first pull-down unit and the second inverter to generate a high-level signal as the enable signal.

2. The delay circuit as claimed in claim 1, wherein the tri-state logic gate further comprises:
   a second pull-down unit coupled to the logic input, for generating a high-level signal when the logic input being at high level;
   a third inverter for converting the high-level signal from the second pull-down unit into a low-level signal; and
   a fourth inverter coupled to a third of the logic outputs, for converting the low-level signal from the third inverter into a high-level signal as the enable signal.

3. The delay circuit as claimed in claim 1, wherein the charging unit is a capacitor.

4. The delay circuit as claimed in claim 1, wherein the comparator is an operational amplifier.

5. A delay circuit, comprising:
   a plurality of current sources;
   a plurality of switches each having a first end and a second end, the first end of each of the switches being coupled to one of the current sources, the second ends of the switches being coupled to an operating node;
   a transistor switch coupled between the operating node and a low voltage and activated for pulling down voltage of the operating node;
   a charging unit coupled between the operating node and the low voltage;
   a comparator having a first input coupled to the operating node and a second input coupled to a reference voltage;
   a tri-state logic gate having a logic input and three logic outputs each for controlling one of the switches, the tri-state logic gate comprising;
      a first pull-up transistor having a first control terminal coupled to the logic input, a first terminal coupled to a high voltage, and a second terminal coupled to the low voltage through a first impedance;
      a first inverter and a second inverter serially coupled between the second terminal of the first pull-up transistor and a first of the logic outputs;
      a first pull-down transistor having a second control terminal coupled to the logic input, a third terminal coupled to the high voltage through a second impedance, and a fourth terminal coupled to the low voltage;
      a NAND logic unit having a first NAND input, a second NAND input, and a NAND output coupled to a second of the logic outputs;
      a third inverter coupled between the third terminal of the first pull-down transistor and the first NAND input;
      a second pull-up transistor having a third control terminal coupled to the logic input, a fifth terminal coupled to the high voltage, and a sixth terminal coupled to the low voltage through a third impedance; and
      a fourth inverter and a fifth inverter serially coupled between the sixth terminal of the second pull-up transistor and the second NAND input.

6. The delay circuit as claimed in claim 5, wherein the charging unit provides an operating voltage for the operating node when the transistor switch is deactivated and the charging unit is charged by one of the current sources through one of the switches.

7. The delay circuit as claimed in claim 6, wherein the comparator deactivates another transistor switch when the operating voltage provided by the charging unit is larger than the reference voltage.

8. The delay circuit as claimed in claim 5, wherein the tri-state logic gate further comprises:
   a second pull-down transistor having a fourth control terminal coupled to the logic input, a seventh terminal coupled to the high voltage through a fourth impedance, and an eighth terminal coupled to the low voltage; and
   a sixth, seventh and eighth inverter serially coupled between the seventh terminal of the second pull-down transistor and a third of the logic outputs.

9. The delay circuit as claimed in claim 5, wherein the charging unit is a capacitor.

10. The delay circuit as claimed in claim 5, wherein the comparator is an operational amplifier.

* * * * *